United States Patent
Bedeschi et al.

(10) Patent No.: US 7,269,080 B2
(45) Date of Patent: Sep. 11, 2007

(54) NONVOLATILE PHASE CHANGE MEMORY DEVICE AND BIASING METHOD THEREFOR

(75) Inventors: Ferdinando Bedeschi, Monza (IT); Claudio Resta, Villa Di Tirano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 16 days.

(21) Appl. No.: 11/195,359

(22) Filed: Aug. 2, 2005

(65) Prior Publication Data

US 2006/0056265 A1   Mar. 16, 2006

(30) Foreign Application Priority Data

Aug. 3, 2004   (EP)   ................................. 04425601

(51) Int. Cl.
*G11C 5/14*   (2006.01)
(52) U.S. Cl. ........................... 365/189.09; 365/185.18; 365/190
(58) Field of Classification Search ........... 365/189.09, 365/185.18, 190, 156, 181
See application file for complete search history.

(56) References Cited

U.S. PATENT DOCUMENTS

| | | | | |
|---|---|---|---|---|
| 5,931,563 A | * | 8/1999 | Jinbo | ..................... 365/185.29 |
| 6,072,722 A | * | 6/2000 | Hirano | ................... 365/185.13 |
| 6,753,561 B1 | | 6/2004 | Rinerson et al. | ............. 257/295 |
| 2002/0089869 A1 | | 7/2002 | Hogan | ......................... 365/105 |
| 2003/0002338 A1 | * | 1/2003 | Xu et al. | ................ 365/185.11 |
| 2003/0123284 A1 | | 7/2003 | Lowrey et al. | .............. 365/175 |
| 2006/0002173 A1 | * | 1/2006 | Parkinson et al. | ........... 365/148 |

* cited by examiner

*Primary Examiner*—Anh Phung
*Assistant Examiner*—Dang Nguyen
(74) *Attorney, Agent, or Firm*—Lisa K. Jorgenson; Robert Iannucci; Seed IP Law Group PLLC

(57) ABSTRACT

A nonvolatile phase change memory device including a memory array formed by memory cells arranged in rows and columns, word lines connected to first terminals of memory cells arranged on the same row, and bit lines connected to second terminals of memory cells arranged on the same column; a row decoder coupled to the memory array to bias the word lines; a column decoder coupled to the memory array to bias the bit lines; and a biasing circuit coupled to the row decoder and to the column decoder to supply a first biasing voltage and a second biasing voltage to the terminals of an addressed memory cell, wherein the first biasing voltage is a positive biasing voltage and the second biasing voltage is a negative biasing voltage.

31 Claims, 2 Drawing Sheets

NONVOLATILE PHASE CHANGE MEMORY DEVICE AND BIASING METHOD THEREFOR

BACKGROUND OF THE INVENTION

1. Field of the Invention

Figure 1:
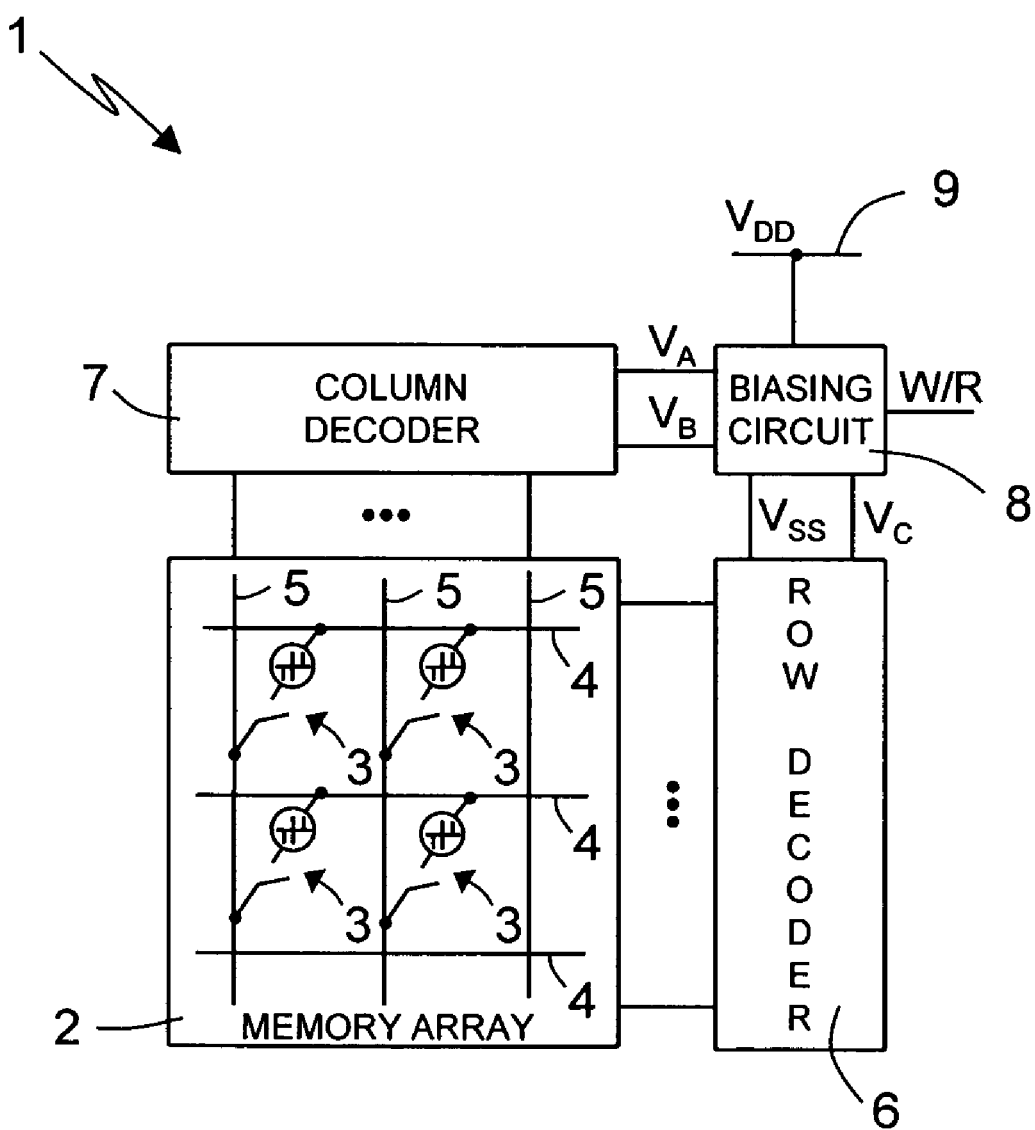

The present invention relates to a nonvolatile phase change memory device and to a biasing method for use in a nonvolatile phase change memory device.

2. Description of the Related Art

A phase change memory (PCM) device, also known as Ovonics Unified Memory (OUM) device, includes a memory array formed by a number of memory cells arranged in rows and columns; word lines connecting first terminals of memory cells arranged on the same row; and bit lines connecting second terminals of memory cells arranged on the same column.

Each memory cell is formed by a memory element and a selection element connected in series, wherein the memory element is based on a class of materials which have the property of changing between two phases, namely from an amorphous, disorderly phase and a crystalline or polycrystalline, orderly phase, which have distinct electrical characteristics, namely considerably different values of resistivity. For a detailed description of PCM devices, reference may be made to WO-A-01/45108, U.S. Pat. No. 5,825,046 and GB 1,296,712.

At present, alloys of elements of group VI of the periodic table, such as Te or Se, referred to as chalcogenides or chalcogenic materials, can advantageously be used in phase change memory cells. The currently most promising chalcogenide is formed by a Ge, Sb and Te alloy (Ge2Sb2Te5) and is widely used for storing information in overwritable disks.

In chalcogenides, the resistivity varies by two or more orders of magnitude when the material passes from the amorphous phase (more resistive) to the crystalline phase (more conductive) and vice versa.

Individual rows of the memory array are addressed by a row decoder which receives an encoded address and biases the addressed and non-addressed word lines at stable and precise voltages, the values thereof depends upon the operation (read, write, erase, verify) to be performed, while individual columns of the memory array are addressed by a column decoder which receives the encoded address and biases the addressed and non-addressed bit lines at stable and precise voltages, the values thereof depends upon the operation (read, write, erase, verify) to be performed.

Nonvolatile phase change memory devices are typically of a so-called single supply voltage type, namely, they receive from outside a single supply voltage currently having a value of 1.65 V, and voltages having higher values than the external supply voltage and required in the various operations to be performed on the memory cells are generated inside the nonvolatile memory device by one or more voltage elevator circuits, generally known as "voltage boosters" or, more commonly, "charge pumps". The boosted voltages supplied by charge pumps are, however, generally far from stable, and consequently are regulated and stabilized by voltage regulators.

In particular, PCM cells require relatively high single bit writing currents, and therefore during writing the addressed bit line is generally biased at relatively high writing voltage, e.g., about 6V the addressed word line is generally biased at a reference voltage, e.g., about 0V, the non-addressed word lines are biased at a first biasing voltage lower than the writing voltage, e.g., equal to two thirds of the writing voltage, i.e., about 4V, and the non-addressed bit lines are biased at a second biasing voltage also lower than the writing voltage, e.g., equal to one third of the writing voltage, i.e., about 2V During reading, instead, the addressed bit line is biased at a reading voltage generally lower than the writing voltage, e.g., about 4V, the addressed word line is biased at the reference voltage, i.e., about 0V, and the non-addressed word and bit lines are biased at the same biasing voltage lower than the reading voltage, e.g., equal to half of the reading voltage, i.e., about 2V.

In the example considered, voltage drop across an addressed PCM cell (i.e., on the series of the memory element and the selection element) is about 6V during writing and about 4V during reading, whereas voltage drop across a non-addressed PCM cell is about 2V during writing and about 0V during reading, not including voltage drops across parasitic resistances of word and bit lines, across output resistances of voltage regulators, and across pass transistors of row and column decoders. Such parasitic voltage drops may range, as a whole, between 0.5V and 1V during writing and are practically negligible during reading.

Use of the aforementioned biasing voltages has negative repercussions both on area occupation of row and column decoders and on power consumption of charge pumps and memory array.

In fact, the use of the aforementioned biasing voltages causes prior art devices to use of medium voltage transistors with a gate oxide thickness of about 12 nm and a minimum channel length of 0.5 µm, and this implies a large area occupation on silicon both for row and column decoders.

Furthermore, the aforementioned biasing voltages generate relatively high leakage currents in the non-addressed memory cells, the sustenance of which implies a non-negligible power consumption due to parasitic dissipation of charge pumps, wirings, etc.

BRIEF SUMMARY OF THE INVENTION

One embodiment of the present invention reduces both area occupation on silicon for row and column decoders and power consumption of the charge pumps and memory array.

According to one embodiment of the present invention, there is provided a nonvolatile phase change memory device formed by memory cells arranged in rows and columns, word lines and bit lines connected to terminals of memory cells arranged in a same row and, respectively, in a same column. A row decoder is coupled to the memory array to bias the word lines. A column decoder is coupled to the memory array to bias the bit lines. A biasing circuit is coupled to the row decoder and to the column decoder to supply a first biasing voltage to a first terminal and a second biasing voltage to a second terminal of an addressed memory cell. The first biasing voltage is a positive biasing voltage and the second biasing voltage is a negative biasing voltage.

BRIEF DESCRIPTION OF THE SEVERAL VIEWS OF THE DRAWING(S)

Figure 2:
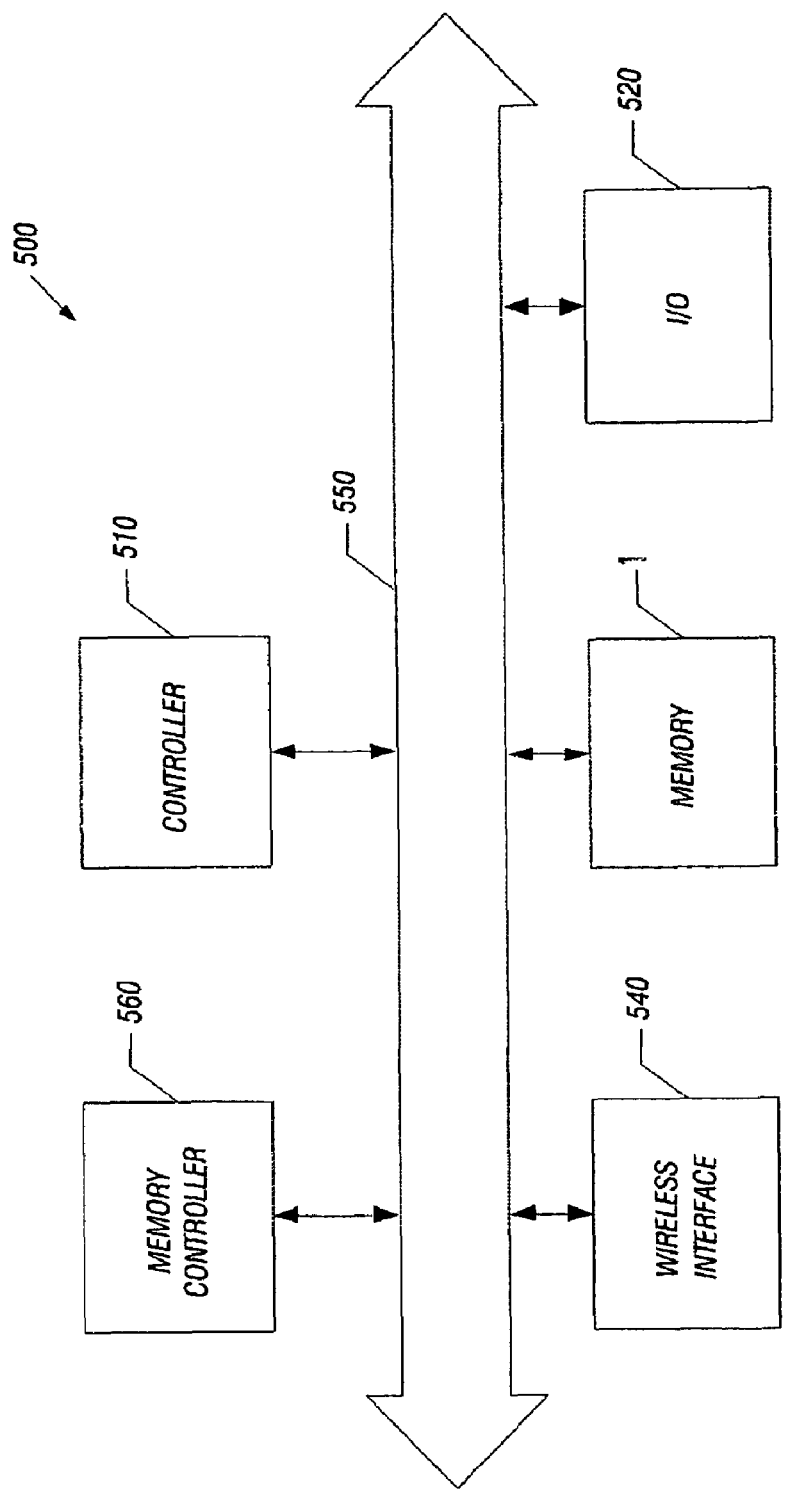

For a better understanding of the present invention, a preferred embodiment thereof is now described, simply as a non-limiting example, with reference to the attached figures, wherein:

FIG. 1 is a circuit diagram of a nonvolatile PCM memory device according to an embodiment of the present invention; and FIG. 2 is a functional block diagram of system according to an embodiment of the present invention.

DETAILED DESCRIPTION OF THE INVENTION

Some embodiments establish the voltage drops of 6V and 4V across the addressed memory cell during writing and reading by supplying the first terminal of the addressed memory cell with a positive biasing voltage lower than that generally used, and the second terminal of the addressed memory cell with a negative biasing voltage.

In other words, the writing and reading voltages are "split" into a positive biasing voltage and a negative biasing voltage, which, when applied to the first and second terminals of the addressed memory cell, establish across the addressed memory cell the voltage drops of 6V and, respectively, 4V during writing and reading.

This "splitting" principle may alternatively be seen as a shifting-down of the biasing voltages applied to the addressed word and bit lines during writing and reading. The biasing voltages applied to the non-addressed word and bit lines during writing and reading are shifted-down accordingly, as explained in more detail hereinafter.

FIG. 1 shows a circuit diagram of a PCM device including a biasing circuit according to one embodiment, of which only the parts necessary for understanding the present invention are shown.

In particular, FIG. 1 shows a nonvolatile memory device 1 including a memory array 2 formed by memory cells 3 arranged in rows and columns and each formed by a memory element and a selection element connected in series; word lines 4, each connecting first terminals of the memory cells 3 arranged in the same row; bit lines 5, each connecting second terminals of the memory cells 3 arranged in the same column; a row decoder 6 connected to the memory array 2 to bias the word lines 4; a column decoder 7 connected to the memory array 2 to bias the bit lines 4; and a biasing circuit 8 connected to the row decoder 6 and the column decoder 7 to supply biasing voltages for the word and bit lines 4, 5.

In particular, biasing circuit 8 has a supply input connected to a supply line 9 set at a supply voltage $V_{DD}$ supplied from outside to the nonvolatile memory device 1; a control input receiving a control signal W/R indicating the operation to be performed on the addressed memory cell 3; a first output connected to the column decoder 7 to supply a first biasing voltage $V_A$ for biasing the addressed bit line 5; a second output connected to the row decoder 6 to supply a second biasing voltage $V_{SS}$ for biasing the addressed word line 4; a third output connected to the column decoder 7 to supply a third biasing voltage $V_B$ for biasing the non-addressed bit lines 5; and a forth output connected to the row decoder 6 to supply a fourth biasing voltage $V_C$ for biasing the non-addressed word lines 4.

Preferably, the first biasing voltage $V_A$ may be equal to about 4V during writing and about 2V during reading; the second biasing voltage $V_{SS}$ may be equal to about −2V during both writing and reading; the third biasing voltage $V_B$ may be equal to about 0V during both writing and reading; and the forth biasing voltage $V_C$ may be equal to about 2V during writing and about 0V during reading.

In this way, during writing the addressed bit line 5 may be biased at about $V_A$=4V, the addressed word line 4 may be biased at about $V_{SS}$=−2V, the non-addressed bit lines 5 may be biased at about $V_B$=0V and the non-addressed word lines 4 may be biased at about $V_C$=2V, whereas during reading the addressed bit line 5 may be biased at about $V_A$=2V, the addressed word line 4 may be biased at about $V_{SS}$=−2V, and the non-addressed word and bit lines 4, 5 may be biased at about $V_B$=$V_C$=0V.

Thus, voltage drop across an addressed PCM cell may be about 6V during writing and about 4V during reading, whereas voltage drop across a non-addressed PCM cells may be about 2V during writing and about 0V during reading.

Shifting-down the biasing voltages allows a reduction of the maximum voltage applied to the terminals of the addressed memory cells, leaving however unchanged the voltage drops across the memory cells necessary during writing and reading.

This has a significant positive repercussion both on area occupation of row and column decoders and on power consumption of charge pumps.

In fact, it allows medium voltage transistors with gate oxide thickness of about 8 nm and minimum channel length of 0.4 μm to be used, thus averagely reducing the area on silicon occupied by the row and column decoders of about 36% with respect to the prior art. The same benefit is also obtained for charge pumps and phase drivers, which are actually larger due to efficiency considerations.

Furthermore, it allows power consumption of charge pumps due to sustenance of the leakage currents in the non-addressed memory cells to be significantly reduced.

From the foregoing it will be appreciated that, although a specific embodiment has been described herein for purposes of illustration, various modifications may be made without deviating from the spirit and scope of the invention, as defined by the appended claims.

For example, since a PCM cell is a symmetrical memory element which can draw current bi-directionally, the biasing voltages applied to the bit and word lines may be appropriately reversed with respect to what has been described above. In particular, during writing the addressed bit line 5 may be biased at $V_{SS}$=−2V, the addressed word line 4 may be biased at $V_A$=4V, the non-addressed bit lines 5 may be biased at $V_C$=2V, and the non-addressed word lines 4 may be biased at $V_B$=0V. Similarly, during reading the addressed bit line 5 may be biased at $V_{SS}$=−2V, the addressed word line 4 may be biased at $V_A$=2V, whereas the non-addressed word and bit lines 4, 5 remain biased at $V_B$=$V_C$=0V.

Furthermore, the positive and negative biasing voltages applied to the addressed memory cells, as well as the biasing voltages applied to the non-addressed memory cells, may be different than those previously described. In particular, the amount of the shifting-down may be different than that previously described, e.g., during writing it may also be 4V. In this case, during writing the addressed bit line 5 may be biased at $V_A$=2V, the addressed word line 4 may be biased at $V_{SS}$=−4V, the non-addressed bit lines 5 may be biased at $V_B$=−2V and the non-addressed word lines 4 may be biased at $V_C$=0V. During writing, the amount of the shifting-down may conveniently be such that $V_A$=−$V_{SS}$=$V_W/2$=3V. In this particular case, during writing the non-addressed bit lines 5 and the non-addressed word lines 4 may both be biased at $V_B$=$V_C$=0V.

Moreover, the relationship between voltage drop across an addressed memory cell and voltage drops across a non-addressed memory cells may be different than those described above.

Turning to FIG. 2, a portion of a system 500 in accordance with an embodiment is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g., a keypad, display), a memory 1, a wireless interface 540, and a memory controller 560 and coupled to each other via a bus 550. A battery, not shown in FIG. 2, may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 1 may be used to store messages transmitted to or by system 500. Memory 1 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 1 may be provided by one or more different types of memory. For example, memory 1 may comprise a volatile memory (any type of random access memory), a non-volatile memory such as a flash memory, and/or crosspoint memory.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or as analog information (if analog information was stored).

While an example in a wireless application is provided above, embodiments may also be used in non-wireless applications as well.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A nonvolatile phase change memory device comprising:
   a memory array formed by memory cells arranged in rows and columns, word lines and bit lines connected to terminals of memory cells arranged in a same row and, respectively, in a same column;
   a row decoder coupled to the memory array to bias the word lines;
   a column decoder coupled to the memory array to bias the bit lines;
   a biasing circuit coupled to the row decoder and to the column decoder to supply a first biasing voltage to a first terminal and a second biasing voltage to a second terminal of an addressed memory cell; and
   wherein the first biasing voltage is a positive biasing voltage and the second biasing voltage is a negative biasing voltage, wherein the biasing circuit is coupled to the row decoder and to the column decoder to further supply a third biasing voltage to a first terminal and a fourth biasing voltage to a second terminal of non-addressed memory cells wherein the third biasing voltage and the fourth biasing voltage are in the range between the first biasing voltage and the second biasing voltage.

2. A nonvolatile phase change memory device according to claim 1 wherein during writing or reading of an addressed memory cell the first biasing voltage and the second biasing voltage have the same absolute values.

3. A nonvolatile phase change memory device according to claim 1 wherein during writing of an addressed memory cell the first biasing voltage and the second biasing voltage have different absolute values.

4. A nonvolatile phase change memory device according to claim 1 wherein the row decoder is coupled to the first terminal and the column decoder is coupled to the second terminal of the addressed memory cell.

5. A nonvolatile phase change memory device according to claim 1 wherein the column decoder is coupled to the first terminal and the row decoder is coupled to the second terminal of the addressed memory cell.

6. A nonvolatile phase change memory device according to claim 1 wherein during writing of the addressed memory cell, the third biasing voltage is lower than the fourth biasing voltage.

7. A nonvolatile phase change memory device according to claim 6 wherein the row decoder is coupled to the first terminal and the column decoder is coupled to the second terminal of the non-addressed memory cell.

8. A nonvolatile phase change memory device according to claim 6 wherein the column decoder is coupled to the first terminal and the row decoder is coupled to the second terminal of the non-addressed memory cell.

9. A nonvolatile phase change memory device according to claim 1 wherein during writing or reading of the addressed memory cell, the third biasing voltage is equal to the fourth biasing voltage.

10. A nonvolatile phase change memory device according to claim 1 wherein memory cells arranged in the same row have first terminals connected to a same word line and memory cells arranged in the same column have second terminals connected to a same bit line.

11. A nonvolatile phase change memory device according to claim 1 wherein memory cells arranged in the same column have first terminals connected to a same bit line and memory cells arranged in the same row have second terminals connected to a same word line.

12. A method of biasing a nonvolatile phase change memory device including a memory array formed by memory cells arranged in rows and columns, word lines and bit lines connected to terminals of memory cells arranged in a same row and, respectively, in a same column; a row decoder coupled to the memory array to bias the word lines; a column decoder coupled to the memory array to bias the bit lines; the method comprising:

biasing a first terminal of an addressed memory cell at a positive first biasing voltage;

biasing a second terminal of the addressed memory cell at a negative second biasing voltage; and biasing a first and a second terminals of non-addressed memory cells at a third biasing voltage and, respectively, a fourth biasing voltage, wherein the third biasing voltage and the fourth biasing voltage are in the range between the first biasing voltage and the second biasing voltage.

13. A biasing method according to claim 12 wherein during writing or reading of the addressed memory cell, the first biasing voltage and the second biasing voltage have the same absolute values.

14. A biasing method according to claim 12 wherein during writing of the addressed memory cell the first biasing voltage and the second biasing voltage have different absolute values.

15. A biasing method according to claim 12 wherein during writing of the addressed memory cell, the third biasing voltage is lower than the fourth biasing voltage.

16. A biasing method according to claim 12 wherein during writing or reading of the addressed memory cell, the third biasing voltage is equal to the fourth biasing voltage.

17. A system comprising:
a processing unit;
an interface coupled to said processing unit; and
a nonvolatile phase change memory device coupled to said interface, wherein the nonvolatile phase change memory device includes a memory array formed by memory cells arranged in rows and columns, word lines and bit lines connected to terminals of memory cells arranged in a same row and, respectively, in a same column; a row decoder coupled to the memory array to bias the word lines; a column decoder coupled to the memory array to bias the bit lines; a biasing circuit coupled to the row decoder and to the column decoder to supply a first biasing voltage to a first terminal and a second biasing voltage to a second terminal of an addressed memory cell; and wherein the first biasing voltage is a positive biasing voltage and the second biasing voltage is a negative biasing voltage, wherein the biasing circuit is coupled to the row decoder and to the column decoder to further supply a third biasing voltage to a first terminal and a fourth biasing voltage to a second terminal of non-addressed memory cells, wherein the third biasing voltage and the fourth biasing voltage are in the range between the first biasing voltage and the second biasing voltage.

18. A system according to claim 17 wherein said interface is a wireless interface.

19. A method of biasing a phase change memory device including an addressed memory cell and a non-addressed memory cell, the method comprising:
providing a first potential to a first terminal of the addressed memory cell wherein the first potential is a negative potential;
providing a second potential to a second terminal of the addressed memory cell;
providing a third potential to a first terminal of the non-addressed memory cell; and
providing a fourth potential to a second terminal of the non-addressed memory cell.

20. A method of biasing according to claim 19 wherein providing the first potential includes providing the first potential to a row decoder that couples the first potential to the first input of the addressed memory cell; and
providing the second potential includes providing the second potential to a column decoder that couples the second potential to the second input of the addressed memory cell.

21. A method of biasing according to claim 19 wherein providing the first potential includes providing the first potential to a column decoder that couples the first potential to the first input of the addressed memory cell; and
providing the second potential includes providing the second potential to a row decoder that couples the second potential to the second input of the addressed memory cell.

22. A method of biasing according to claim 19 wherein providing the third potential includes providing the third potential to a row decoder that couples the third potential to the first input of the non-addressed memory cell;
providing the fourth potential includes providing the fourth potential to a column decoder that couples the fourth potential to the second input of the non-addressed memory cell; and
wherein the third potential lower than the fourth potential.

23. A method of biasing according to claim 19 wherein providing the third potential includes providing the third potential to a column decoder that couples the third potential to the first input of the non-addressed memory cell;
providing the fourth potential includes providing the fourth potential to a row decoder that couples the fourth potential to the second input of the non-addressed memory cell; and
wherein the third potential lower than the fourth potential.

24. A method of biasing according to claim 19 wherein the magnitude of the third potential is similar to the magnitude of the fourth potential.

25. A method of biasing according to claim 19 wherein the third potential and fourth potential are within a range between the first potential and the second potential.

26. A method of biasing according to claim 19 further comprising writing to the addressed memory cell.

27. A method of biasing according to claim 19 further comprising reading from the addressed memory cell.

28. A system according to claim 17 wherein the row decoder is coupled to the first terminal and the column decoder is coupled to the second terminal of the addressed memory cell.

29. A system according to claim 17 wherein during writing of the addressed memory cell, the third biasing voltage is lower than the fourth biasing voltage.

30. A system according to claim 17 wherein the row decoder is coupled to the first terminal of the non-addressed memory cell and the column decoder is coupled to the second terminal of the non-addressed memory cell.

31. A system according to claim 17 wherein during writing or reading of the addressed memory cell, the third biasing voltage is equal to the fourth biasing voltage.

* * * * *